(12) United States Patent
Lordi

(10) Patent No.: US 7,358,512 B1
(45) Date of Patent: Apr. 15, 2008

(54) DYNAMIC PATTERN GENERATOR FOR CONTROLLABLY REFLECTING CHARGED-PARTICLES

(75) Inventor: Vincenzo Lordi, Livermore, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 207 days.

(21) Appl. No.: 11/391,976

(22) Filed: Mar. 28, 2006

(51) Int. Cl.
*G21K 4/00* (2006.01)

(52) U.S. Cl. ............... 250/492.24; 250/492.22; 250/492.23; 250/396 R; 250/398; 430/5; 430/4

(58) Field of Classification Search ......... 250/492.22, 250/492.23, 396 R, 398, 492.24, 492.2, 492.3; 430/5, 4
See application file for complete search history.

(56) References Cited

U.S. PATENT DOCUMENTS

| | | | |
|---|---|---|---|
| 5,254,417 A * | 10/1993 | Wada | ............ 430/5 |
| 6,177,218 B1 | 1/2001 | Felker et al. | |
| 6,207,965 B1 | 3/2001 | Koike | |
| 6,235,450 B1 | 5/2001 | Nakasuji | |
| 6,291,119 B2 | 9/2001 | Choi et al. | |
| 6,333,508 B1 | 12/2001 | Katsap et al. | |
| 6,414,313 B1 | 7/2002 | Gordon et al. | |
| 6,429,443 B1 | 8/2002 | Mankos et al. | |
| 6,511,048 B1 | 1/2003 | Sohda et al. | |
| 6,525,328 B1 | 2/2003 | Miyoshi et al. | |
| 6,573,516 B2 | 6/2003 | Kawakami | |
| 6,586,733 B1 | 7/2003 | Veneklasen et al. | |
| 6,605,811 B2 | 8/2003 | Hotta et al. | |
| 6,610,890 B1 | 8/2003 | Garcia de Quesada Fort et al. | |
| 6,657,211 B2 | 12/2003 | Benner | |
| 6,674,086 B2 | 1/2004 | Kamada | |
| 6,870,172 B1 * | 3/2005 | Mankos et al. | ........ 250/492.22 |

* cited by examiner

*Primary Examiner*—Jack I. Berman
*Assistant Examiner*—Michael Maskell
(74) *Attorney, Agent, or Firm*—Okamoto & Benedicto LLP

(57) ABSTRACT

One embodiment relates to a dynamic pattern generator for controllably reflecting charged particles. The generator includes at least a controllable light emitter array, an optical lens, and an array of light-sensitive devices. The controllable light emitter array is configured to emit a pattern of light. The optical lens is configured to demagnify the pattern of light. The array of light-sensitive devices is configured to receive the demagnified pattern of light and to produce a corresponding pattern of surface voltages. Other embodiments and features are also disclosed.

20 Claims, 9 Drawing Sheets

US 7,358,512 B1

DYNAMIC PATTERN GENERATOR FOR CONTROLLABLY REFLECTING CHARGED-PARTICLES

CROSS-REFERENCE TO RELATED APPLICATIONS

The present application is related to U.S. patent application Ser. No. 10/851,040 (now U.S. Pat. No. 6,870,172), filed May 21, 2004, by inventors Marian Mankos et al., and entitled "Maskless Reflection Electron Beam Projection Lithography." The present application is also related to U.S. patent application Ser. No. 10/851,041, filed May 21, 2004, by Harald F. Hess et al., and entitled "Reflective Electron Patterning Device and Method of Using Same." The disclosures of the above-referenced patent applications are hereby incorporated by reference.

BACKGROUND OF THE INVENTION

1. Field of the Invention

The present invention relates generally to pattern generation for use in electron beam lithography and other applications.

2. Description of the Background Art

Electron-Beam Direct Write Lithography

As is understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm.

EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography. In other words, EBDW lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current density exceeds a certain threshold, electron-electron interactions cause the beam to blur.

Conventional Electron-Beam Projection Lithography

In electron-beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers.

Projecting the electron-beam over a relatively wide area enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, there are various difficulties in that approach. For example, there is the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system is not normally buildable using integrated circuits because such integrated circuits are opaque to electrons.

Another disadvantage of conventional electron-beam projection lithography systems is that a corresponding mask is necessary for each structure to be exposed. The preparation of customer-specific circuits in small numbers is not economic, because of the high costs associated with mask production.

SUMMARY

Figure 1:
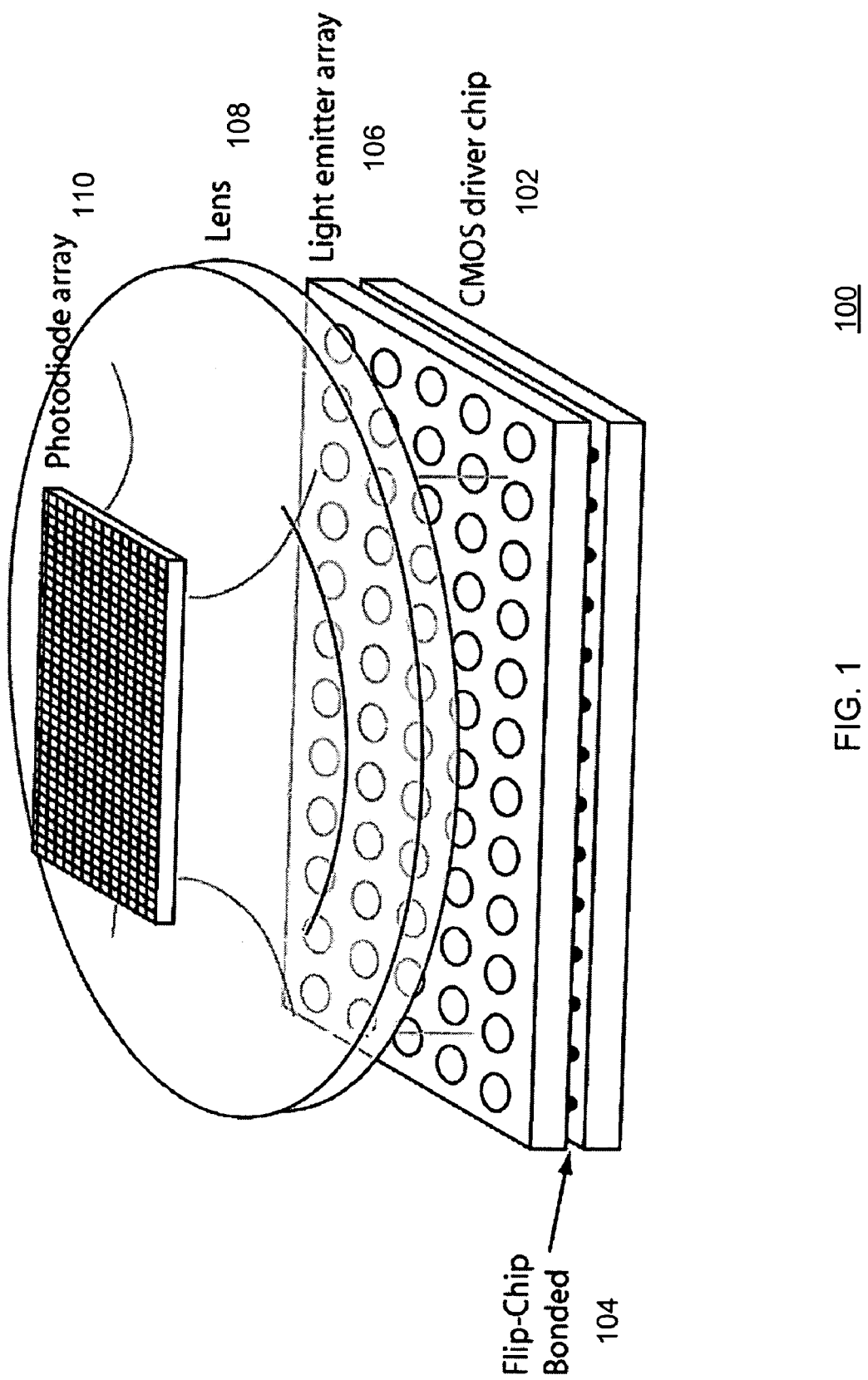
FIG. 1 is a perspective diagram depicting a dynamic pattern generator for controllably reflecting electrons in accordance with an embodiment of the invention.

One embodiment relates to a dynamic pattern generator for controllably reflecting charged particles. The generator includes at least a controllable light emitter array, an optical lens, and an array of light-sensitive devices. The controllable light emitter array is configured to emit a pattern of light. The optical lens is configured to demagnify the pattern of light. The array of light-sensitive devices is configured to receive the demagnified pattern of light and to produce a corresponding pattern of surface voltages.

Another embodiment relates to a method of controllably reflecting charged particles. A pattern of light is controllably emitted from a light emitter array. The pattern of light is demagnified using a lens, and the demagnified pattern of light is received by an array of light-sensitive devices. The array of light-sensitive devices produce a corresponding pattern of surface voltages for reflecting the charged particles.

Other embodiments and features are also disclosed.

DETAILED DESCRIPTION

Reflective Electron-Beam Lithography

One embodiment of the present invention relates to a technique for electron-beam lithography that overcomes the above-discussed disadvantages and problems with conventional electron beam lithography. This technique may be called reflective electron-beam lithography and is a form of electron-beam projection lithography. Reflective electron-beam lithography is described in U.S. patent application Ser. No. 10/851,040 (now U.S. Pat. No. 6,870,172), filed May 21, 2004, by inventors Marian Mankos et al., and entitled "Maskless Reflection Electron Beam Projection Lithography," the disclosure of which is incorporated herein by reference.

While conventional electron-beam projection lithography directly projects a partitioned flood beam onto a substrate, reflective electron-beam lithography re-directs the beam out of the direct line of sight between the electron source and the semiconductor wafer or other substrate. The beam is re-directed such that it impinges upon a reflective electron patterning device. The reflective electron patterning device may be a dynamic pattern generator for controllably reflecting electrons.

Dynamic Pattern Generator for Controllably Reflecting Electrons

Previous implementations of reflective electron patterning devices are described in U.S. patent application Ser. No. 10/851,041, filed May 21, 2004, by Harald F. Hess et al., and entitled "Reflective Electron Patterning Device and Method of Using Same," the disclosure of which is incorporated herein by reference. These previous implementations include using CMOS-driven metallic pixels. The size of such pixels is largely determined as a multiple of the size of the transistors. As such, the size of the pixels depends upon the size of the transistors and in some cases may be too large for practical application in a lithography tool.

Disadvantageously, these previous implementations rely on current (or even next generation) semiconductor fabrication processes and technologies to form the pixels of the dynamic pattern generator. The consequences of this include relatively low voltage differentials (typically 1.0 to 1.5 volts, or less) and relatively large pixels (2 microns×2 microns pixel size may be approximately the lower limit using current semiconductor fabrication processes and technologies).

The relatively large pixel size for previous implementations requires a correspondingly high level of de-magnification to perform lithography. For example, a 2 micron size generator pixel would have to be de-magnified by at least 90 times to achieve an on-wafer pixels size of 22.5 nanometers (nm) for a target 45 nm resolution lithography. Such high de-magnifications may be limited due to the limitations of electromagnetic lens aberrations. In addition, for high throughput lithography, the relatively large pixel size requires a large illumination size, which may be disadvantageous due to the limitations of electromagnetic lens aberrations.

Furthermore, the relatively small voltage differential of the previous implementations limits the level of contrast between on and off pixels. There is limited control available to tune (increase) the voltage differential because it is tied to the fabrication technology used. Means to expand the range of the voltage differential in previous implementations further increase the pixel size.

In contrast to these previous implementations, the present application discloses a dynamic pattern generator which uses light to enable pattern transfer from a large integrated circuit structure to a smaller-area pattern generator. The smaller-area pattern generator may then be used to transform a single, spread electron beam into a patterned array, useful for lithography or other applications. The smaller pixel size of the smaller-area pattern generator reduces the de-magnification needed. In addition, the decoupling between the control circuitry and the physical pixels allows the pattern generator to produce higher voltage differentials. Larger-size transistors may be used to take advantage of less expensive fabrication technology.

FIG. 1 is a perspective diagram depicting a dynamic pattern generator for controllably reflecting electrons in accordance with an embodiment of the invention. The dynamic pattern generator includes a light emitter array 106 and a photodiode array 110. The light emitter array 106 comprises a relatively dense array of semiconductor light emitters, and the photodiode array 110 comprises a separate, denser array. The light emitters on the light emitter array 106 may be driven by the directly-coupled driver array circuit (CMOS driver chip) 102. The driver array circuit 102 may be flip-chip bonded 104 to the light emitter array 106. An optical lens 108 focuses (de-magnifies) light from the emitter array 106 onto a photodiode array 110.

In one embodiment, the light emitter devices of the light emitter array 106 may be vertical light-emitting diodes (LEDs). The use of vertical LEDs for the light emitters allows the formation of a dense array on a semiconductor wafer. In contrast to lasers, for example, the LEDs may be operated in a "sub-threshold" mode to generate a low light level required for this use. In addition, the LEDs are more readily compatible with a CMOS driver circuit 102.

In an alternate embodiment, the emitter devices of the light emitter array 106 may be resonant-cavity light emitting diodes (RCLEDs). The use of RCLEDs may provide further advantages of more directional light output and lower driver current requirements for the same light power output. The structure and fabrication of an example RCLED array is described below in relation to FIGS. 3 and 4.

The photodiode array 110 may be fabricated with the desired pixel size for the dynamic pattern generator. In accordance with an embodiment of the invention, the pixel size of the photodiode array 110 may be independent of the pitch of the light-emitter array 106. The optical lens 108 is configured to transfer a de-magnified image from the light-emitter array 106 to the photodiode array 110.

In accordance with an embodiment of the invention, the photodiodes in the array 110 are configured to operate in an open circuit condition. When light is incident on the "back side" of the photodiode pixel in open circuit condition, excess electron-hole pair generation causes a potential (an open circuit voltage) to build up across the diode. In one implementation, with the back side of the photodiode array 110 held at the potential of the electron beam gun, a voltage differential is induced on the "top side" of those diodes which are illuminated on their bottom sides. The induced voltage on the top side of the back-side illuminated diodes may be used to cause reflection of incident electrons from the electron beam gun. Thus, a dynamic pattern in the reflected electron beam may be generated. Advantageously, the voltage differential between back-side illuminated and unilluminated photodiodes may be determined by the material used in fabricating the photodiode array 110, independent of the drive voltage used to operate the light-emitter array 106.

In accordance with one embodiment of the invention, both the LEDs of the emitter array 106 and the photodiodes of the photodiode array 110 may be fabricated using an AlGaAs/GaAs materials system.

The AlGaAs/GaAs materials system allows freedom in band gap engineering of the various layers in the device structures within the one to three volt range compatible with the potential differential required for electron reflection by the photodiode array 110 with an adequate contrast ratio. In addition, the AlGaAs/GaAs materials system is lattice matched over the entire composition range, allowing growth of structures with arbitrary thicknesses (particularly useful for distributed Bragg reflectors for RCLED devices) using well-controlled processes.

AlGaAs with Al content below 40% is also a direct band gap semiconductor. This allows for the fabrication of efficient photodiodes for the photodiode array 110, as well as RCLEDs for the emitter array 106. Short carrier lifetimes and high carrier mobility advantageously allow the devices to operate at very high speeds. Advantageously, the photodiodes may be operable without amplifier circuits so that their bandwidth need not be limited by such amplifier circuits.

The operating wavelength of light (and AlGaAs material compositions) depend on the desired voltage swing for the pattern generator (i.e. for the photodiode array 110. For illustrative purposes, consider an operating wavelength of 700 nanometers (1.77 electron-Volts). Such an operating wavelength provides a practical voltage swing of around 1.3 to 1.5 volts for the pattern generator and also allows for the use of high quality, stable materials for both active and transparent regions of the device structures. In other implementations, other wavelengths may be used.

Driver Array Circuit

Figure 2:
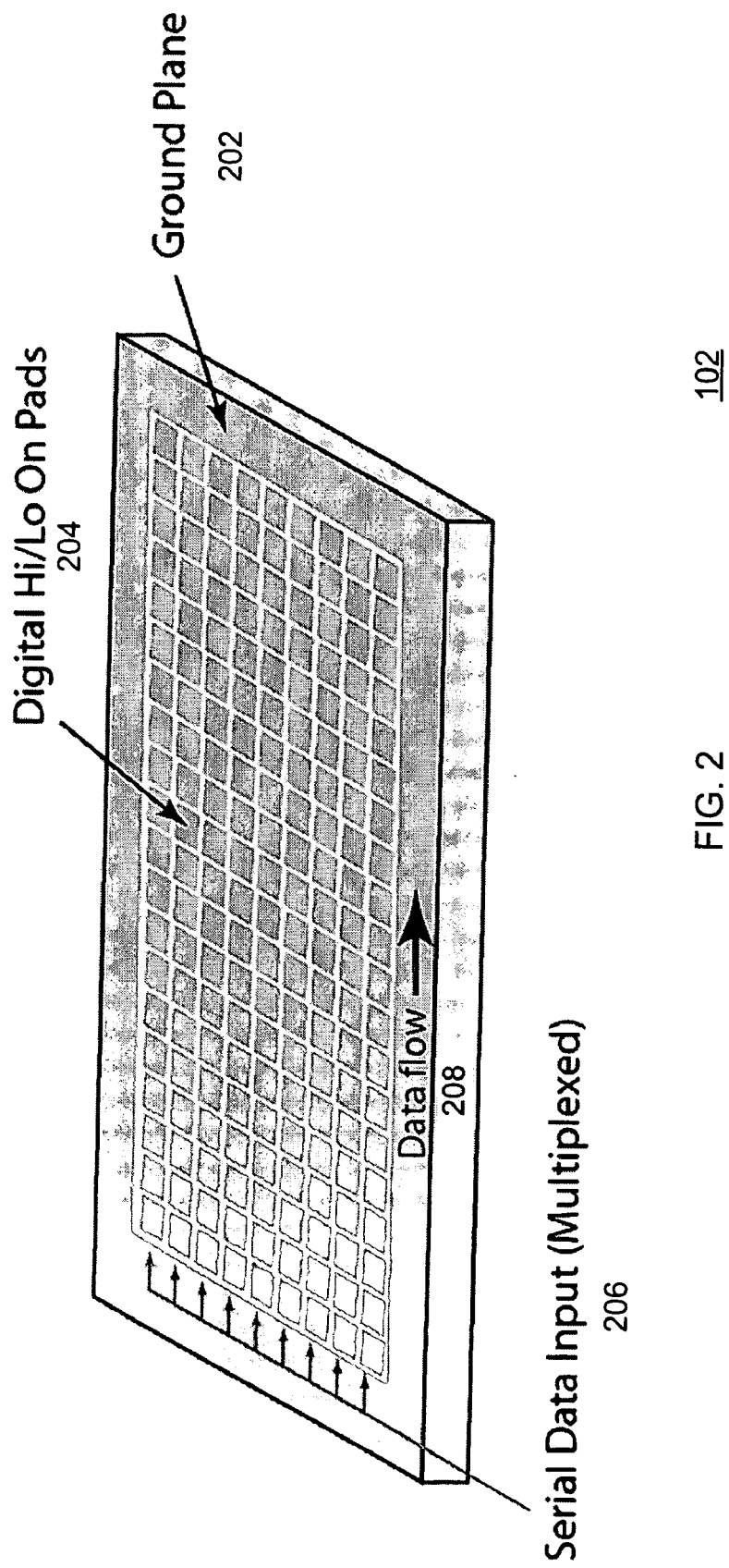
FIG. 2 is a schematic perspective diagram of a CMOS driver chip in accordance with an embodiment of the invention.

FIG. 2 is a schematic perspective diagram of a driver array circuit (CMOS driver chip) 102 in accordance with an embodiment of the invention. The driver array circuit 102 may include an array of surface pads (digital hi/lo pads) 204 surrounded by a ground plane 202. The array of surface pads may be digitally driven between ground and a supply voltage (Vcc for CMOS). As shown schematically in FIG. 2, serial data may be input (multiplexed) 206 into the driver array circuit 102. The data may flow 208 across the array to the individual pads.

The supply voltage (approximately 1 to 2 volts for CMOS) is sufficient to drive the LEDs, which are configured to operate "sub-threshold" with very low output power in the nanoWatt range. Here, "sub-threshold" refers to operation at very low current levels, near the elbow of the forward current-voltage characteristic. The switched voltage on the pads of the driver array circuit causes corresponding LEDs to light up, which in turn bias the photodiodes for pattern generation. This preferred embodiment utilizes digital switching with the photodiodes operating in saturation. Alternatively, analog control may be used.

The pads 204 of the driver array circuit may be configured with a relatively small pitch between mesas, on the order of 5 to 20 microns, matching the pitch (and approximate size) of the LED mesas that are bonded to them. This pitch may be designed as small as practical to minimize the overall power consumption as well as minimize the optical demagnification onto the photodiode array, but the pitch need not approach fabrication limits. A target pitch of around 10 microns, for example, may be appropriate.

The area surrounding the active pad array 204 may comprise a reasonably wide ground plane 202. Such a ground plane perimeter 202 may be used to facilitate flip-chip bonding 104 of the LED substrate 106 onto the driver array substrate 102 by using larger solder bumps for the taller space at the ground plane perimeter 202 (see FIG. 8).

The fabrication of the pad array 204 may involve fabricating vias above each digital driver element (arrayed below the pads) to connect to the pads. In one implementation, a series of shift registers may be configured so as to be fed by a de-multiplexed serial data stream (see de-multiplexed data flow 208 in FIG. 2). The shift registers may comprise flip-flop circuits which may be readily fabricated on this size scale using presently available technology. The multiplexed serial data 206 may be fed into one end of the array structure, as illustrated in FIG. 2, and may be clocked down the array after de-multiplexing the data. Such a configuration may be advantageously compatible with certain electron beam exposure modes (for example, time delay integration, gray scaling, and so forth). This configuration also allows a large array of pixels to be fed by a single serial data stream that needs to be only as fast as the width of the array times the clock rate down the array. Such an approach is advantageously scalable in "width" by increasing the number of parallel rows in the array 204 and/or in "length" by incorporating additional input data streams 206.

Resonant-Cavity Light Emitting Diode

In one embodiment, the light emitter array 106 may be a resonant-cavity light emitting diode (RCLED) array. An RCLED array chip may be grown by molecular beam epitaxy (MBE) or by organometallic vapor phase epitaxy (OMVPE) or by another layered growth technique.

Figure 3:
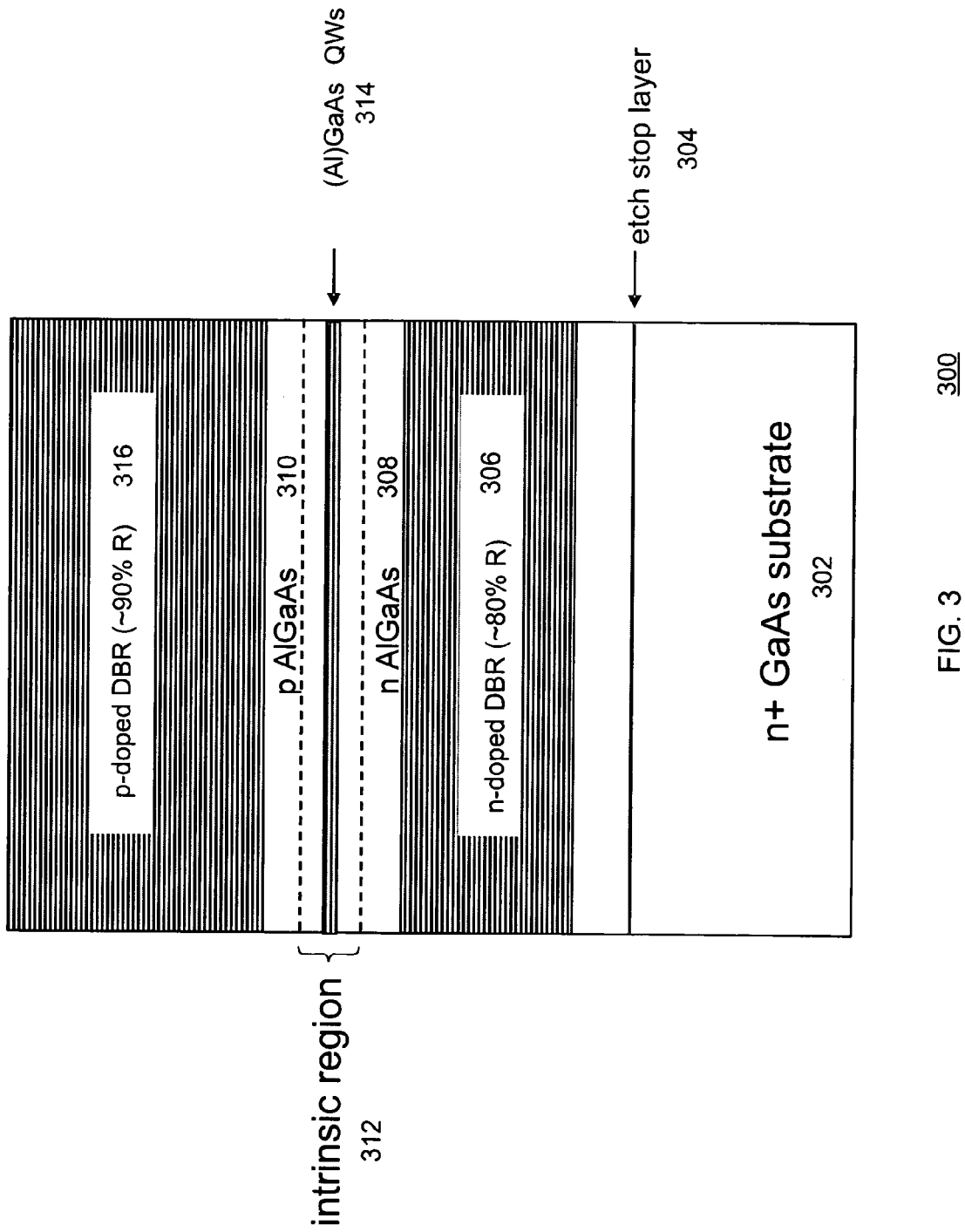
FIG. 3 is a schematic cross-sectional diagram of an epitaxial layer structure for a resonant-cavity light emitting diode (RCLED) in accordance with an embodiment of the invention.

FIG. 3 is a schematic cross-sectional diagram of an epitaxial layer structure 300 for a resonant-cavity light emitting diode (RCLED) in accordance with an embodiment of the invention. The epitaxial structure 300 may be fabricated on a GaAs substrate 302.

For operation using light of around 700 nm wavelength, a GaAs substrate and the AlGaAs/GaAs material system may be utilized. For operation at other wavelengths, different materials may be used.

The AlGaAs/GaAs material system allows distributed Bragg reflectors (DBRs) (306 and 316) to be integrated monolithically to create the resonant cavity. The DBRs may be configured, for example, with mirror reflectivities of about 90% for the higher reflector 316 and 50% to 85% for the out-coupler 306. AlGaAs quantum wells 314 may be utilized as the active light emitter. The AlGaAs quantum wells 314 may be sandwiched between an n-doped AlGaAs layer 308 and a p-doped AlGaAs layer 310. An intrinsic region may be defined 312 in the region in the vicinity of the junction between the n-doped and p-doped layers.

Figure 4:
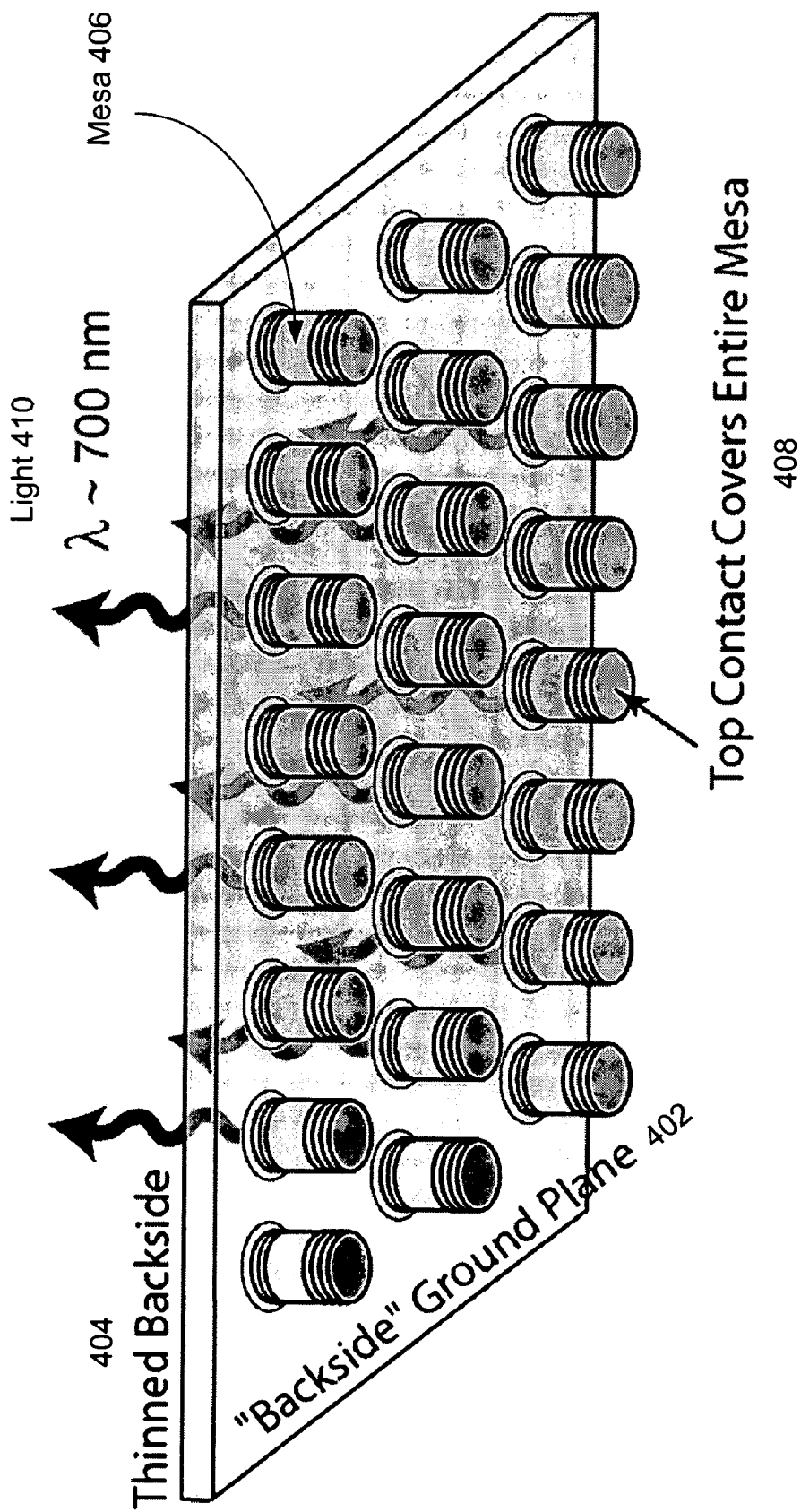
FIG. 4 is a schematic perspective diagram of a fabricated RCLED structure in accordance with an embodiment of the invention.

FIG. 4 is a schematic perspective diagram of a fabricated RCLED structure 400 in accordance with an embodiment of the invention. The individual LEDs in the array are defined and isolated by etched mesas 406. To facilitate interfacing with the driver array circuitry, a bottom-emitting (through the substrate) configuration may be utilized. In other words, the LEDs emit light 410 through the substrate and out of its backside 404.

Evaporated metal discs (patterned using lift-off, for example) may form the contact 408 on the mesa tops and may also be used as self-aligned etch masks to define the mesas 406. After etching to a lower contact layer, a bottom "ground plane" metal contact may deposited (again, using lift-off, for example). The chip may then be flip-chip bonded to the driver array chip, with the mesa tops 408 bonded to the individual pads on the driver array. Large indium solder bumps may be used in multiple locations around the periphery of the array to bond the ground planes of the two chips, so as to span the approximately 0.5 to 3.0 micron height differential between the top and bottom of the mesas. Mechanical stability and passivation of the flip-chip bonded structure may be achieved by flowing epoxy between the two chips.

Since the GaAs substrate 302 absorbs 700 nm light, a substrate thinning step may be employed after flip-chip bonding. This thinning may be accomplished by growing a high Al content AlGaAs or AlAs etch stop layer 304 into the structure (see FIG. 3). A selective etch, such as citric acid:hydrogen peroxide, may then be used to remove the GaAs. The etchstop layer may also be removed with an additional selective etch, if desired, for example, by using a hydrochloric acid etch. A thin layer of GaAs ("Backside" Ground Plane) 402 is left on the chip after substrate etching to maintain the ground plane connection across the array (see FIG. 4).

Photodiode Array

The photodiode array 110 may include a back-illuminated structure to allow the top surface potential to be controlled by the light coming from the light emitters 106 below. Substrate removal may be performed if the substrate (for example, GaAs) is insufficiently transparent at the wavelengths appropriate to achieve sufficient voltage swings (for example, over one volt potential swing) at the top surface. However, if the substrate is removed, then a mechanical support may be required for the very thin membrane that will remain. A transparent structure such as quartz may be used, for example.

Figure 5:
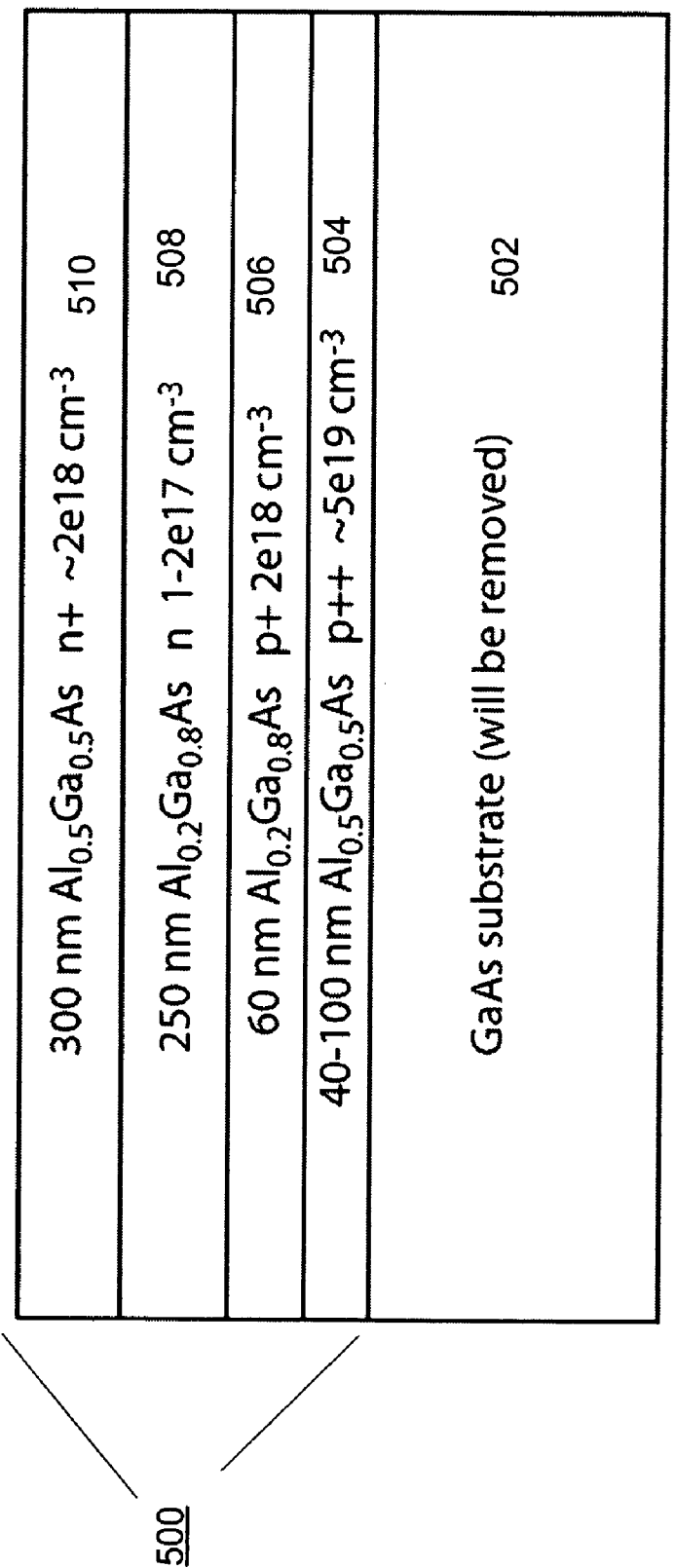
FIG. 5 is a schematic cross-sectional diagram of an epitaxial layer structure for a photodiode wafer in accordance with an embodiment of the invention.

FIG. 5 is a schematic cross-sectional diagram of an epitaxial layer (epilayer) structure 500 for a photodiode wafer in accordance with an embodiment of the invention. The epitaxial structure 500 may be fabricated on a GaAs substrate 502. The epitaxial device may be grown with MBE or OMVPE or other layered growth technique. The GaAs substrate 502 may be removed later and the structure flipped over so that the illumination will be incident upon the top layer 510 in FIG. 5.

A p/n junction may be formed between two $Al_{0.2}Ga_{0.8}As$ layers, one being a p+ doped layer 506 (for example, about 60 nm thick with doping concentration of about $2 \times 10^{18}$ $cm^{-3}$) and one being an n-doped layer 508 (for example, about 250 nm thick with doping concentration in a range of 1 to $2 \times 10^{17}$ $cm^{-3}$).

The $Al_{0.5}Ga_{0.5}As$ layers below 504 and above 510 the p/n junction serve as transparent layers. The heavily-doped p++ lower layer 504 (for example, in a range of 40 to 100 nm thick with doping concentration of roughly $5 \times 10^{19}$ $cm^{-3}$) serves to deplete carriers from the surface and minimize surface recombination. The n+ doped top layer 510 (for example, about 300 nm thick with doping concentration of roughly $2 \times 10^{18}$ $cm^{-3}$) serves as a transparent contact (to the quartz substrate).

The overall thickness of the epilayer structure (not counting the GaAs substrate) 500 is preferably configured to allow for the practical etching of the isolation trenches between pixels, while providing sufficient light collection. Doping levels are preferably selected so that the diffusion lengths in each layer nearly match the layer thicknesses, allowing the full structure to efficiently contribute to the induced photovoltage.

The specific design shown in FIG. 5 is bandgap engineered to operate with light of 700 nm wavelength. The absorbing layers (506 and 508) have a bandgap about 4 kT below the light energy, and the transparent layers (504 and 510) have a bandgap about 4 kT above the light energy. These bandgap estimates include bandgap renormalization effects from the high doping levels in some layers.

The particular design shown in FIG. 5 has the p-type layer on top (exposed to the electron beam). This implies a positive bias with respect to the backside or ground plane when illuminated. In an alternate design, it may be desirable to design the inverse structure and impart a negative bias with illumination. Applicants believe that the particular design shown in FIG. 5 allows for higher efficiency operation and somewhat simpler fabrication. However, either polarity design may be used.

Figure 6:
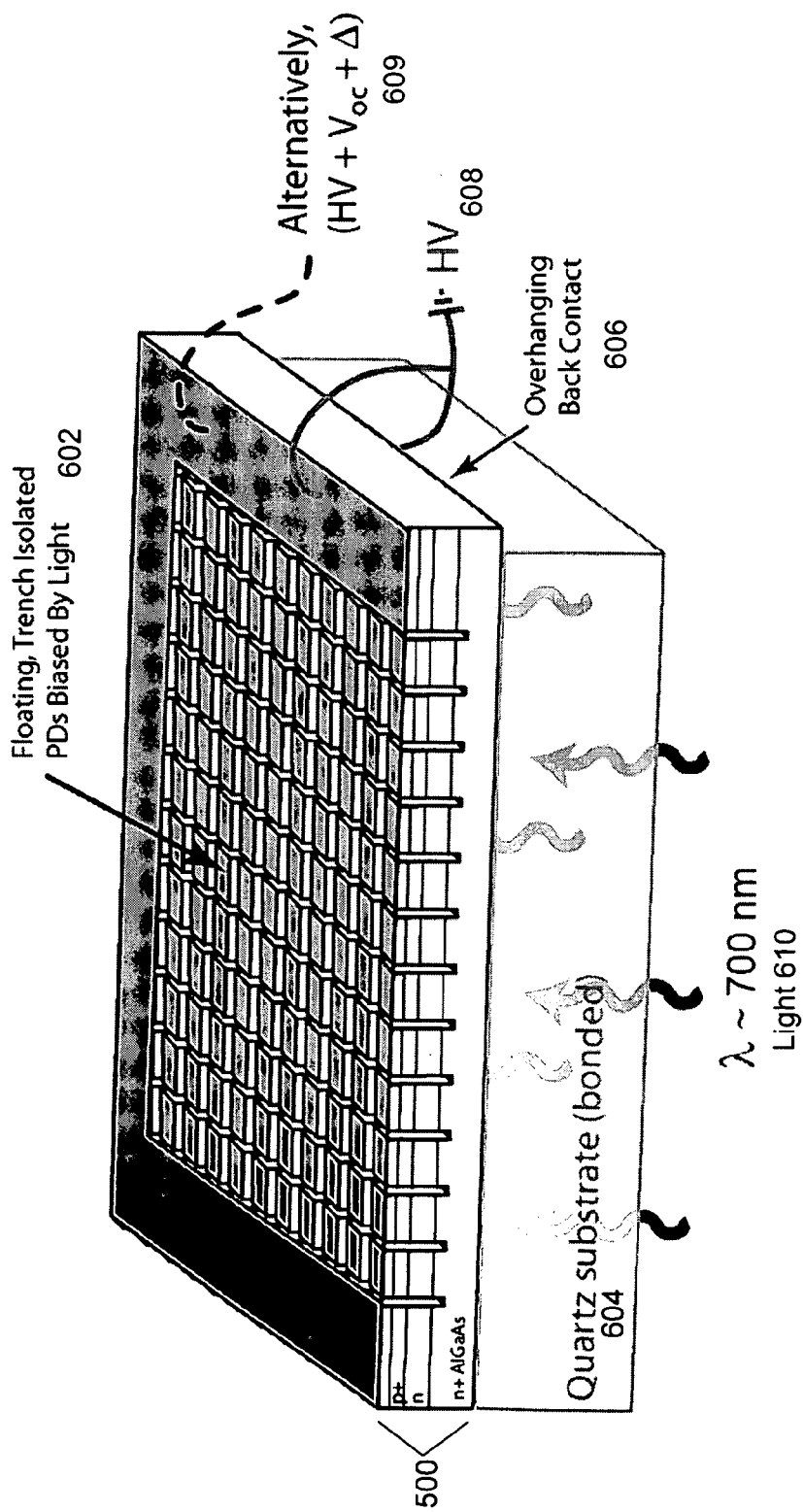
FIG. 6 is a schematic perspective diagram of a fabricated photodiode wafer structure in accordance with an embodiment of the invention.

In accordance with an embodiment of the invention, after the epitaxial device structure 500 is formed, the process to fabricate the photodiode array chip 110 may proceed as follows. A finished photodiode array chip 110 after the process is depicted in FIG. 6.

(a) Deposit and anneal a standard n-type metal contact (for example, Au/Ge/Ni/Au) patterned with a window cover over the region that will become the active pixel area. This metal will become the backside contact to the photodiode array chip 110.

(b) Deposit a thin oxide layer (for example, with plasma enhanced chemical vapor deposition or PECVD) over the metal contact and bond the wafer 500 face down (reverse of FIG. 5) onto a quartz wafer 600 using spin-on-glass or other suitable bonding agent. The oxide layer promotes adhesion to the quartz. The quartz 604 becomes transparent support for the epilayer structure 500 after substrate 502 removal. The epitaxial wafer 500 preferably overhangs 606 the quartz wafer 604 in order to allow contact to be made to the backside after fabrication is complete.

(c) Perform substrate 502 removal. The substrate removal may be performed using, for example, citric acid:hydrogen peroxide selective GaAs etch that stops on the p++ $Al_{0.5}Ga_{0.5}As$ layer 504. This etch stop and window layer is preferably selected so as to be sufficiently thick to accommodate any over-etching which may be required for complete substrate removal.

(d) The isolation trench pattern to separate the individual pixels 602 may be defined on the new top surface using lithography. The lithography used may be, for example, conventional electron-beam lithography. This defines the array of pixels.

(e) Vertical trenches are then etched through the lithographically-defined mask so as to form the floating, trench-isolated photodiode pixels 602. For example, the etching may be performed using inductively-coupled plasma etching to enable deep vertical trenches.

(f) Top p-type metal (for example, Ti/Pt/Au) may then be evaporated onto the etched pixels at a steep angle. The steep-angled evaporation is used to prevent shorting between pixels. This top metal layer may not be needed if the bare semiconductor exhibits a homogeneous voltage potential across the surface.

(g) A short oxide etch may be performed to remove the thin oxide layer from the backside metal overhanging the quartz so as to expose the back contact. This oxide etch may also remove a very slight thickness of the quartz wafer, possibly leaving a quartz surface that is not optical smooth. In such a case, polishing may be used to provide an optically-smooth surface. Alternatively, this etch step may be performed between steps (b) and (c). However, it is preferably performed after step (e) to keep the metal covered by the thin oxide layer during the etching in step (e) and avoid exposed metal in the semiconductor etch chamber.

The finished photodiode array 110 may be configured with a high voltage (HV) 608 applied to both the overhanging back contact and the top metal. Alternatively, a higher voltage (HV+Voc+Δ) 609 may be applied to the top-side ground plane (while HV is applied to the back contact). This alternate applied voltage configuration provides a dark (electron absorbing) background for lithography in this positive-polarity design.

Figure 7:
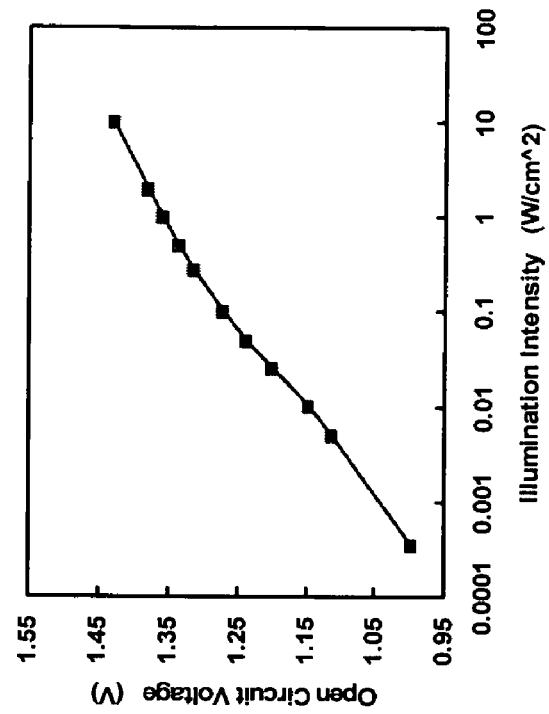
FIG. 7 depicts graphs of open circuit voltage versus illumination intensity (plotted on (a) linear and (b) semi-log scales) in accordance with an embodiment of the invention.
Figure 7:
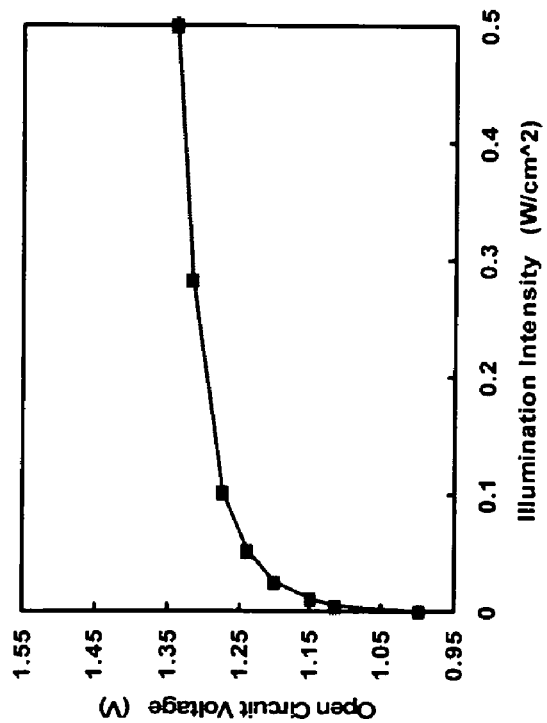

Simulated pixel performance (voltage expression versus illumination intensity) of the epilayer structure 500 in FIG. 5 is shown in FIG. 7. In particular, FIG. 7 depicts graphs of open circuit voltage versus illumination intensity (plotted on (a) linear and (b) semi-log scales) in accordance with an embodiment of the invention.

As a point of reference, 10 nanowatts (nW) of 700 nm wavelength light incident on a 0.25 micron×0.25 micron pixel is equivalent to 16 Watts/cm² intensity, and at 10 MHz repetition rate represents 3,500 electrons per pulse. Hence, the data depicted in FIG. 7 shows that only nanowatts of light is needed per pixel to generate a sufficiently saturated voltage expression on the top surface of the photodiodes. Additionally, only a few to tens of electrons will be injected into each dark pixel from absorption of the electron beam during the refresh time. This small amount of injected electrons will have a negligible effect on the surface potential of the dark pixels.

Assembly

Figure 8:
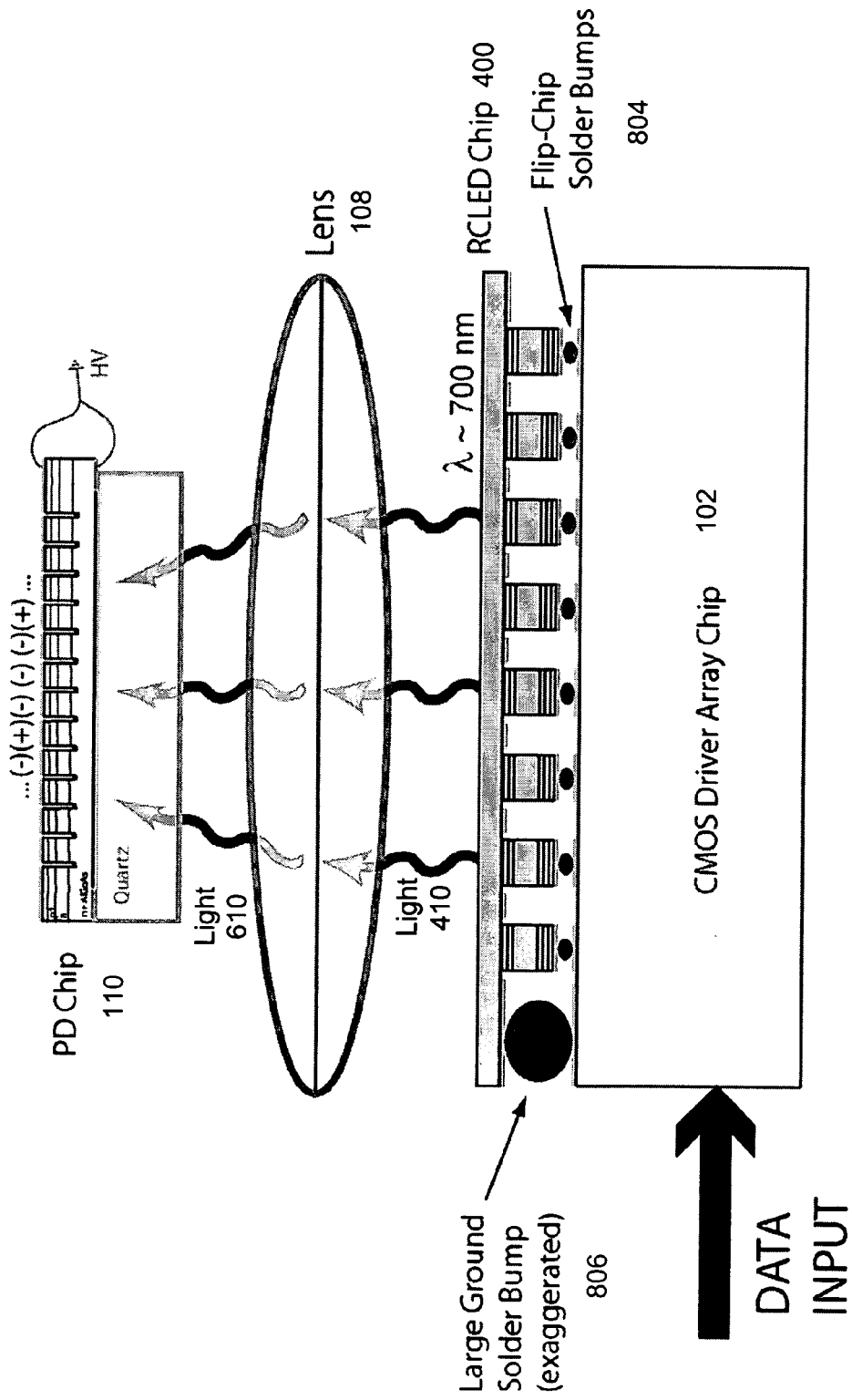
FIG. 8 is a schematic cross-sectional diagram showing an assembly of the components for a dynamic pattern generator in accordance with an embodiment of the invention.

FIG. 8 is a schematic cross-sectional diagram showing an assembly 800 of the components for a dynamic pattern generator in accordance with an embodiment of the invention. The illustration is not to scale. As shown in FIG. 8, a lens 108 is positioned in between the RCLED chip 400 and the photodiode (PD) array 110. The lens 108 is configured to demagnify the image from the RCLED array 400.

A mechanism is used to align the photodiode array to the RCLED array. For example, alignment marks in the wafer periphery may be made, and backside illumination may be employed for alignment under a microscope. The aligned components may then be fixed with epoxy, for example, or a mechanical mount that would allow easier replacement of individual components.

The lens 108 in FIG. 8 effectively serves to optically scale down the pixels on the CMOS driver array chip 102 to a more practical size, such that less electron beam demagnification is needed from the PD chip 110 (the pattern generator) to the target wafer for a lithography application. Advantageously, the assembly 800 of FIG. 8 achieves the scale down (demagnification) with light optics which typically has less aberration than electron optics. In addition, this scale down (demagnification) is achieved while maintaining a compact assembly.

For example, using 0.5 micron×0.5 micron pixels on the PD array and 10 micron pitch between LEDs requires a 20 times optical demagnification in the assembly, followed by a 22 times demagnification in the electron projection optics to achieve 22.5 nm size pixels on the wafer for 45 nm lithography. In contrast, an "all CMOS" implementation of the dynamic pattern generator using 5 micron×5 micron pixels would require 222 times demagnification in the electron projection optics to achieve the same 22.5 nm on-wafer pixel size.

Also as shown in FIG. 8, solder bumps may be used to bond the emitter array chip 400 to the driver array chip 102 using flip-chip bonding techniques. The solder bumps may include flip-chip solder bumps 804 and a series of larger solder bumps 806 around the periphery to connect the ground planes of the two chips. In addition, the empty volume between the chips may be backfilled with epoxy after bonding to provide passivation and mechanical stability.

The full metal coatings 408 over the mesa tops that form the array of contacts on the RCLED chip 400 may also prevent stray light from entering the driver array circuitry 102. Otherwise, such stray light may degrade performance.

Furthermore, FIG. 8 illustrates how the high voltage supply needs to be connected only to the photodiode chip. This allows the floating pads of the photodiode array to form the programmable voltage pattern for the electron beam swath. Because the driver array chip 102 is electrically isolated from the photodiode array chip 110, no high voltage need be applied to the driver array chip 102. Hence, the difficulties and problems of high voltage supply design and shielding for the CMOS circuitry of the driver array chip 102 may be avoided. Furthermore, the driver array chip 102 and the RCLED chip 400 are protected from potentially damaging high voltage arcing events in the system.

As an additional feature, an immersion high index fluid may be utilized between the lens 108 and the photodiode array 110. Such an immersion high index fluid may advantageously allow for high numerical aperture imaging for a large field of view and improved resolution of transfer of the pattern from the RCLED array to the photodiode array.

Reflective Electron-Beam Lithography System

Figure 9:
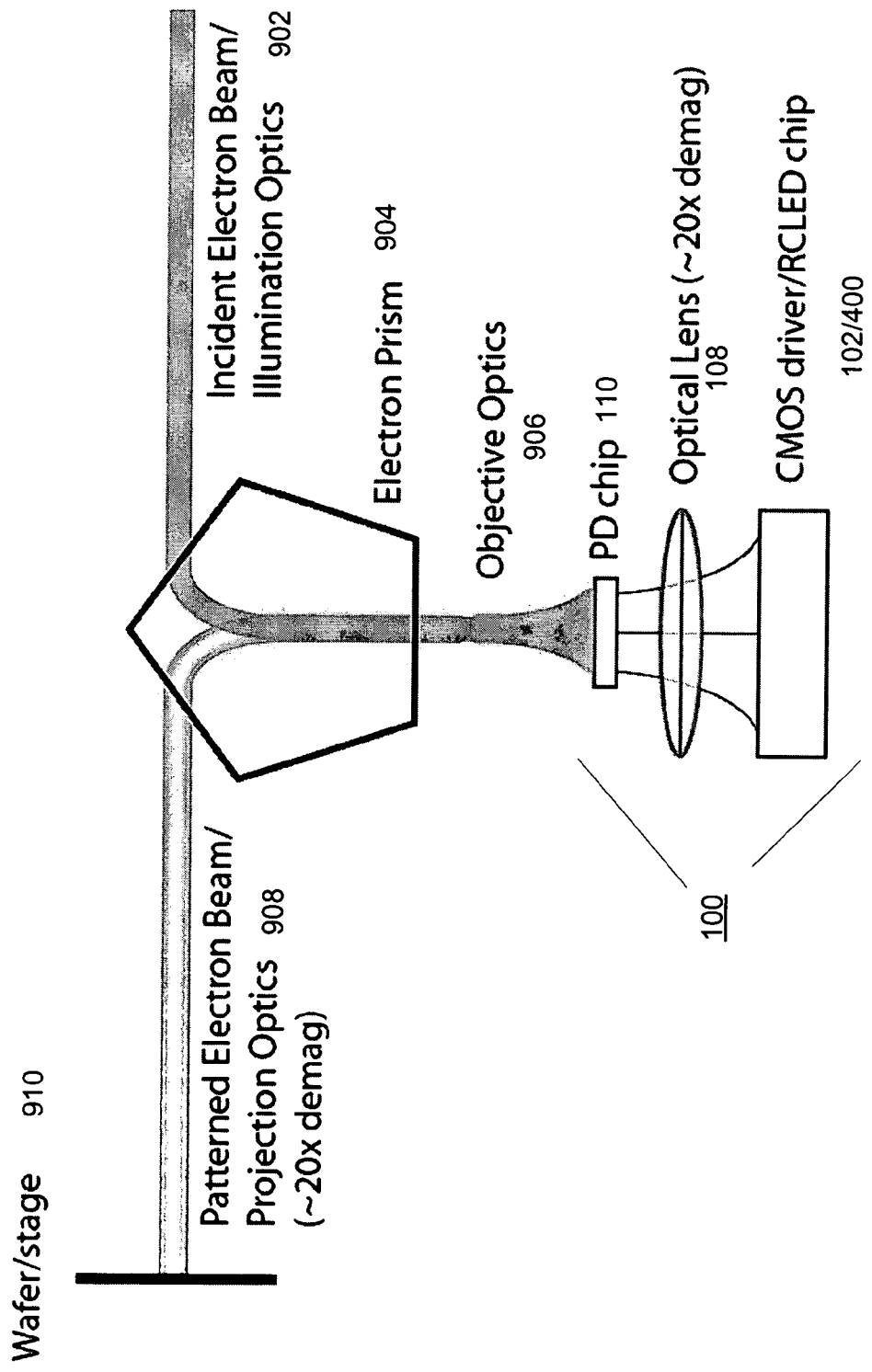
FIG. 9 is a schematic diagram showing a reflective electron-beam lithography system including a dynamic pattern generator in accordance with an embodiment of the invention.

FIG. 9 is a schematic diagram showing a reflective electron-beam lithography (REBL) system 900 including a dynamic pattern generator in accordance with an embodiment of the invention. As depicted, the system 900 includes illumination electron-optics 902 for providing the incident electron beam, an electron prism 904, an objective electron lens (magnifying and shaping) 906, a dynamic pattern generator 100, projection electron-optics 908 to project the patterned electron beam, and a stage 910 for holding a wafer or other target to be lithographically patterned.

In accordance with an embodiment of the invention, the dynamic pattern generator 100 may be implemented as describe above, for example, using a photodiode chip 110, optical lens 108, RCLED chip 400, and CMOS driver 102. The other components of the system 100 are discussed in further detail in U.S. patent application Ser. No. 10/851,040 (now U.S. Pat. No. 6,870,172), filed May 21, 2004, by inventors Marian Mankos et al., and entitled "Maskless Reflection Electron Beam Projection Lithography," the disclosure of which is hereby incorporated by reference.

In the system 900, a relatively broad incident electron beam impinges on the pattern generator 100 with relatively low landing energy. The low landing energy may be accomplished by holding the photodiode chip 110 of the pattern generator 100 at nearly the same potential as the electron source. The low energy beam interacts with the dynamically controlled voltage pattern on the surface of the photodiode chip 110. An image of that pattern is reflected in the form of a patterned electron beam. The projection electron-optics 908 demagnifies the patterned electron beam to expose a patterned area on the wafer.

As shown in FIG. 9, light optics is used to demagnify the pitch of the CMOS driver circuitry, and so lessens the demagnification needed by the projection electron-optics, as discussed above. The required size of the broad incident electron beam is also reduced, lessening the burden on the illumination and objective lens designs. The decoupling of the pattern generator pixel size from the pitch of the CMOS driver circuitry also readily allows for extension of this system to future lithography technology generations.

The dynamic pattern generator disclosed herein provides various advantages. For example, it decouples the control electronics from the physical pixels that pattern the beam. This allows the pixel size to be independent of the fabrication and circuit technologies of the control electronics. Hence, sub-micron pixel sizes may be fabricated. This lessens the demagnification required by the projection electron-optics and the field size required of the illumination/objective optics. The decoupling between the control circuitry and the physical pixels also allows the pattern generator to produce voltage differentials that are independent of the supply voltage of the control circuitry. Furthermore, the decoupling isolates the control circuitry from the high voltage of the electron beam system, and so avoids the need to float the control circuitry at high voltage. The entire device may also be constructed so as to be compact and field-replaceable as a single unit. Finally, the dynamic pattern generator disclosed herein readily scales to future lithography technologies.

Various fabrication and implementation alternatives are disclosed in the above description. For example, different material systems may be used for the LED and/or PD array chips so as to operate at different wavelengths and/or to optimize device lifetime, reliability and the like. The epitaxial structures may be grown by various methods, including MBE and OMVPE. A conventional LED structure may be used for the light emitters, instead of RCLEDs. It may also be possible to use vertical-cavity surface emitting lasers (VCSELs) or other laser structures for the light emitters. Multiple methods of attaching the LED chip, lens, and PD chip into an aligned unit may be used, including epoxy or mechanical mounts. As another alternative, the components may be kept separate in the system without creating a single replaceable unit. The attachment method, for example epoxy, may include means to control the index of refraction between the lens and the photodiode array and/or the lens and the emitter array. High index fluid may alternatively be used.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A dynamic pattern generator for controllably reflecting charged particles, the apparatus comprising:
   a controllable light emitter array configured to emit a pattern of light;
   an optical lens configured to demagnify the pattern of light; and
   an array of light-sensitive devices configured to receive the demagnified pattern of light and to produce a corresponding pattern of surface voltages.

2. The dynamic pattern generator of claim 1, wherein the charged particles comprise electrons.

3. The dynamic pattern generator of claim 1, further comprising an electronic driver circuit coupled to the light emitter array for controllably driving the light emitter array.

4. The dynamic pattern generator of claim 3, further comprising a flip-chip bond between the light emitter array and the electronic driver circuit.

5. The dynamic pattern generator of claim 1, wherein the light emitter array comprises an array of resonant-cavity light emitting diodes (RCLEDs).

6. The dynamic pattern generator of claim 5, wherein the array of RCLEDs comprises an array of RCLED mesas configured on a thin substrate.

7. The dynamic pattern generator of claim 6, further comprising solder bumps electrically connecting the RCLED mesas with contact pads of a driver array circuit.

8. The dynamic pattern generator of claim 1, wherein the light emitter array comprises an array of vertical light emitting diodes.

9. The dynamic pattern generator of claim 1, wherein the light emitter array comprises an array of vertical-cavity surface emitting lasers.

10. The dynamic pattern generator of claim 1, wherein the lens demagnifies the pattern of light by twenty times or more.

11. The dynamic pattern generator of claim 1, wherein the array of light-sensitive devices comprise a photodiode array.

12. The dynamic pattern generator of claim 1, wherein the array of light-sensitive devices comprises pixels of 0.5 micron by 0.5 micron size or smaller.

13. The dynamic pattern generator of claim 1, wherein the reflected charged particles are demagnified and projected onto a substrate for maskless lithography.

14. A method of controllably reflecting charged particles, the method comprising:
   controllably emitting a pattern of light from a light emitter array;
   demagnifying the pattern of light using a lens;
   receiving the demagnified pattern of light by an array of light-sensitive devices; and
   producing a corresponding pattern of surface voltages for reflecting the charged particles.

15. The method of claim 14, wherein the charged particles comprise electrons.

16. The method of claim 15, wherein the reflected electrons are demagnified and projected onto a substrate for maskless lithography.

17. The method of claim 14, wherein the pattern of light is demagnified by at least twenty times.

18. The method of claim 14, wherein the array of light-sensitive devices comprises pixels of 0.5 micron by 0.5 micron size or smaller.

19. An apparatus for controllably reflecting electrons, the apparatus comprising:
   means for controllably emitting a pattern of light from a light emitter array;
   means for demagnifying the pattern of light using a lens;
   means for receiving the demagnified pattern of light by an array of light-sensitive devices; and
   means for producing a corresponding pattern of surface voltages for reflecting the electrons.

20. The apparatus of claim 19, wherein the reflected electrons are demagnified and projected onto a substrate for maskless electron beam lithography.

* * * * *